(12) United States Patent
Kock et al.

(10) Patent No.: US 7,079,431 B2
(45) Date of Patent: Jul. 18, 2006

(54) ARRANGEMENT WITH A MEMORY FOR STORING DATA

(75) Inventors: Ernst Josef Kock, Kirchseeon (DE); Walter Mischo, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/997,321

(22) Filed: Nov. 24, 2004

(65) Prior Publication Data

US 2005/0111285 A1 May 26, 2005

(30) Foreign Application Priority Data

Nov. 26, 2003 (EP) .................................. 03027143

(51) Int. Cl.
*G11C 29/00* (2006.01)
*G11C 7/00* (2006.01)

(52) U.S. Cl. .................................. 365/200; 365/189.02
(58) Field of Classification Search .................. 365/49, 365/63, 189.02 X, 200 O, 230.01; 714/711 X, 714/764 X
See application file for complete search history.

(56) References Cited

U.S. PATENT DOCUMENTS

| | | | |
|---|---|---|---|
| 5,438,546 A | 8/1995 | Ishac et al. ................. 365/200 |
| 5,708,613 A | 1/1998 | Creed et al. ................ 365/200 |
| 5,793,683 A | 8/1998 | Evans ........................ 365/200 |
| 6,314,031 B1 | 11/2001 | Sellmair et al. ............ 365/200 |
| 6,671,834 B1 * | 12/2003 | Zhu et al. ................... 714/711 |
| 6,751,138 B1 * | 6/2004 | Kuroda et al. ............. 365/200 |
| 6,862,700 B1 * | 3/2005 | Zhu et al. ................... 714/711 |
| 6,868,022 B1 * | 3/2005 | Scheuerlein et al. ........ 365/201 |
| 2003/0076716 A1 | 4/2003 | Paul et al. .................. 365/200 |

FOREIGN PATENT DOCUMENTS

| | | |
|---|---|---|
| EP | 0 392 895 A2 | 3/1990 |
| EP | 0 442 301 A2 | 1/1991 |

OTHER PUBLICATIONS

IBM Technical Disclosure Bulletin; vol. 37, No. 06A; "Bit Sparing Logic for Semiconductor Memory Systems".

* cited by examiner

*Primary Examiner*—VanThu Nguyen
(74) *Attorney, Agent, or Firm*—Baker Botts L.L.P.

(57) ABSTRACT

An arrangement with a memory for storing data has a first memory for storing data, switching devices which stipulate whether access to the first memory involves output of the data stored in the first memory or other data, and a second memory for storing the other data. The arrangement is distinguished in that it contains a third memory (103, 203, 310), which is addressed by the address (A) which is used to access the first memory or by a portion (AH) of this address and contains information about which data in the first memory are to be replaced with other data.

23 Claims, 4 Drawing Sheets

ARRANGEMENT WITH A MEMORY FOR STORING DATA

PRIORITY

This application claims priority to European application No. 03 027 143.1 filed Nov. 26, 2003.

TECHNICAL FIELD OF THE INVENTION

The present invention relates to an arrangement having
a first memory for storing data,
switching devices which stipulate whether access to the first memory involves output of the data stored in the first memory or other data, and
a second memory for storing the other data.

BACKGROUND OF THE INVENTION

By way of example, the second memory is a memory for storing data which actually need to be stored in the first memory but cannot be stored there because the first memory's storage elements which are to be used for storing these data are faulty. Memories like the second memory are frequently also referred to as redundancy memories. In an arrangement of this type, the switching devices can stipulate whether access to the first memory involves output of the data stored in the first memory or the data stored in the second memory.

Figure 4:
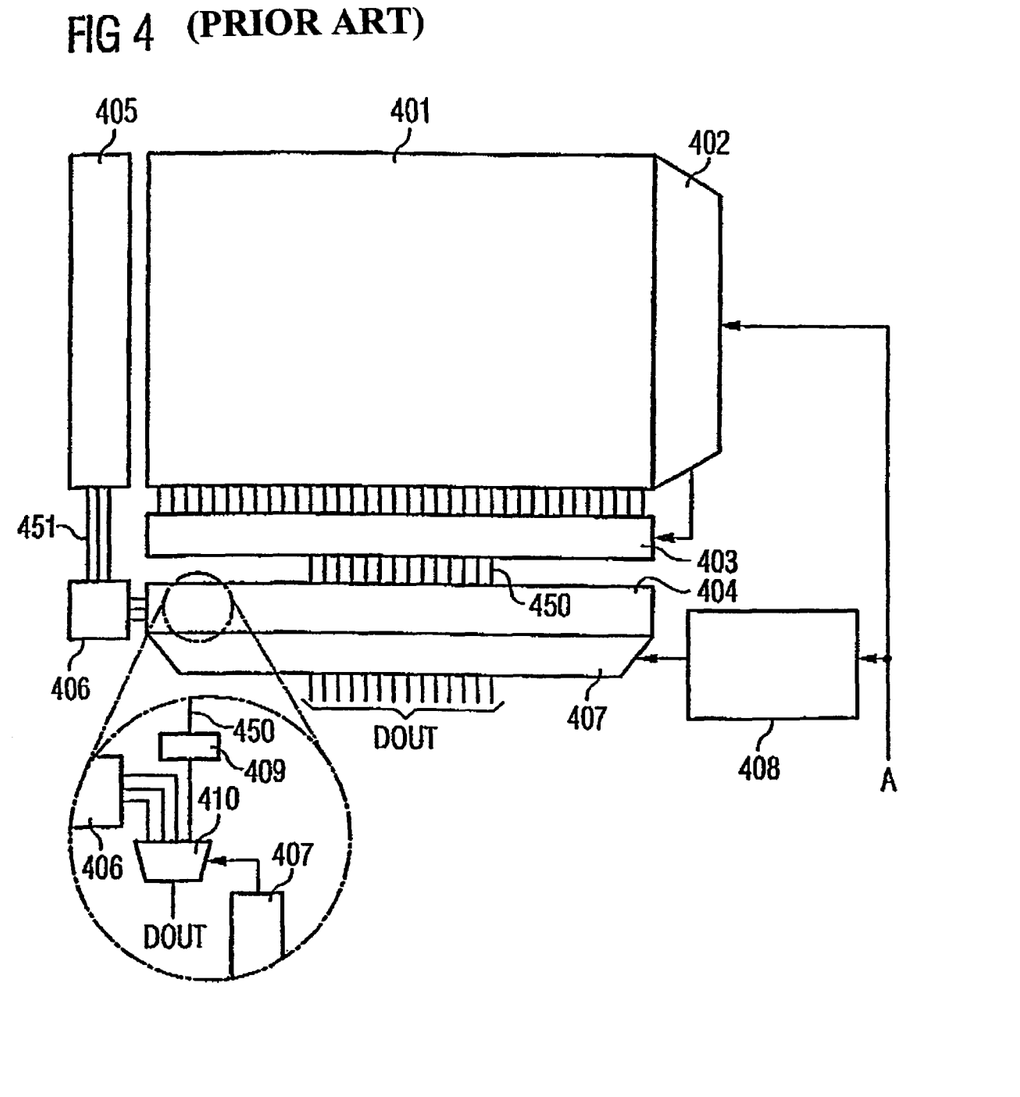
FIG. 4 shows the design of a conventional arrangement with a redundancy memory.

A conventional arrangement of this type is illustrated in FIG. 4.

The arrangement shown in FIG. 4 comprises a first memory 401, a first address decoder 402, a second address decoder 403, a sense-amplifier and selection unit 404, a second memory 405, a sense-amplifier unit 406, a control device 407 and a checking device 408.

The main component of the arrangement shown in FIG. 4 is the first memory 401. This memory is a memory for storing data, and this memory is accessed as standard when data are to be written to the arrangement or when data are to be read from the arrangement. The first memory 401 may contain errors, like any electrical or electronic device. More precisely, it may contain faulty storage elements in which no data can or should be stored. The data which cannot or should not be stored in the first memory 401 on account of faults in the first memory 401 are stored in the second memory 405. The second memory 405 is a redundancy memory for storing data which actually need to be stored in the first memory 401 but cannot be stored there because the first memory's storage elements which are to be used for the storage are faulty.

The control device 407, the checking device 408 and portions of the sense-amplifier and selection unit 404 ensure that instances of access to faulty areas of the first memory 401 involve output of data stored in the second memory 405. This is explained in more detail below:

If data are to be read from the memory 401, the arrangement is supplied with an address A at which the required data are stored within the first memory 401. The address A is supplied to the first address decoder 402 and to the second address decoder 403. The first address decoder 402 selects the word line to which the storage elements which are to be read are connected, and the second address decoder 403 selects the bit lines to which the storage elements which are to be read are connected. The bit lines selected by the second address decoder 403 are connected to the sense-amplifier and selection unit 404 via lines 450. The sense-amplifier and selection unit 404 contains a number of sense amplifiers 409 which corresponds to the number of lines 450, and the same number of switching devices, formed generally by multiplexers 410. The input sides of the sense amplifiers are connected to the lines 450, and the sense amplifiers use known methods to ascertain the content of the storage elements which are to be read in the first memory 401.

At the same time as data are being read from the first memory 401, data are read from the second memory 405. In the example under consideration, all storage elements which are connected to a word line in the second memory 405 which (word line) is associated with the selected word line in the first memory 401 are respectively read. In the example under consideration, three respective storage elements in the second memory are read. The bit lines 451 connected to the storage elements in the second memory 405 which are to be read are connected to the sense-amplifier unit 406. The sense-amplifier unit 406 contains a number of sense amplifiers which corresponds to the number of lines 451. The input sides of the sense amplifiers are connected to the lines 451, and the sense amplifiers use known methods to ascertain the content of the storage elements which are to be read in the second memory 405.

The output signals from the sense amplifiers 409 in the sense-amplifier and selection unit 404 and the output signals from the sense amplifiers in the sense-amplifier unit 406 are supplied to the multiplexers 410 provided in the sense-amplifier and selection unit 404. More precisely, each multiplexer 410 is supplied with the output signal from an associated sense amplifier 409 in the sense-amplifier and selection unit 404, and with the output signals from all of the sense amplifiers in the sense-amplifier unit 406. The multiplexers 410 are controlled by the control device 407. The multiplexers 410 output data DOUT which are simultaneously the data which are to be output by the arrangement as a reaction to the access to the arrangement.

The multiplexers 410 are controlled by the control device 407 on the basis of whether or not the storage elements which are to be read in the first memory 401 include faulty storage elements.

Whether this is the case is communicated to the control device 407 by the checking device 408. The checking device 408 stores the addresses whose use involves access to faulty storage elements. The checking device 408 checks whether the address A supplied to the arrangement matches one of the addresses stored in the checking device 408, and communicates the result of this check to the control device 407.

The control device 407 therefore ascertains how it needs to actuate the multiplexers 410. It actuates the multiplexers 410 such that they switch through the signal which the sense amplifier 409 supplies to them if the storage element in the first memory 401 whose content is represented by the signal in question is not faulty, and that they switch through one of the signals which the sense-amplifier unit 406 supplies to them if the storage element in the first memory 401 whose content is represented by the output signal from the sense amplifier is faulty.

In this manner, even if the first memory 401 contains faulty storage elements, it is always possible to output correct data, specifically without the need for the user to consider any special features for this purpose; from the point of view of the user, it makes no difference whether a sound first memory or an unsound first memory is being accessed.

However, replacing faulty storage elements in the first memory 401 with associated memory elements in the second memory 405 is associated with significant complexity. Particularly the comparisons between the address A and the addresses stored in the checking device 408 and also the ascertainment, performed by the control device 407, of the control signals controlling the multiplexers 410 are very time-consuming, which means that the data DOUT which are output from arrangements of the type shown in FIG. 4 are generally available at a later time than is the case with arrangements without redundancy memories.

SUMMARY OF THE INVENTION

The present invention is therefore based on the object of developing the arrangement such that the data which are to be output from the arrangement are available at an earlier time than is the case with conventional arrangements of this type.

The invention can achieve this object by an arrangement comprising a first memory for storing data, switching devices which stipulate whether access to the first memory involves output of the data stored in the first memory or other data, a second memory for storing the other data, and a third memory, which is addressed by the address which is used to access the first memory or by a portion of this address and contains information about which data in the first memory are to be replaced with other data.

The first memory and the second memory can be formed by different areas of a single memory. The second memory and the third memory can be formed by different areas of a single memory. The third memory can be formed by a reprogrammable memory. The third memory can be formed by a RAM. A switching device can be provided for each bit of the data which are to be output from the arrangement. The switching devices each may have a plurality of input connections, with one bit of the data stored in the first memory being applied to one input connection and one or more bits of the data stored in the second memory being applied to one or more other input connections. The switching devices can be formed by multiplexers. The data stored in the second memory can be data which actually need to be stored in the first memory but cannot be stored there because the storage elements which are to be used for storing these data are faulty. Access to the first memory also may involve access to the second memory. Access to the first memory also may involve access to the third memory. The data word which is output from the third memory when the third memory is accessed may contain the control data which are to be used to actuate the switching devices. The data word which is output from the third memory when the third memory is accessed may contain data which specify which switching devices are to be actuated such that they switch through data stored in the second memory instead of the data stored in the first memory. The data word which is output from the third memory when the third memory is accessed may contain the address at which the other data are stored. The data word which is output from the third memory when the third memory is accessed may contain the other data. The data word which is output from the third memory when the third memory is accessed may contain an address portion, this address portion being the address of a data word stored in partly faulty storage elements which is within a memory area in the first memory specified by the address used to address the third memory. The data word which is output from the third memory when the third memory is accessed may contain further data, but these further data are used only if there is a match between the address portion contained in the data word and that portion of the address used to address the first memory which is not contained in the address used to address the third memory. The further data may comprise data which is output from the third memory when the third memory is accessed and may contain data from the group consisting of the other data, the address at which the other data are stored, information which specifies which information is represented by the remaining data in the data word, information which specifies how the remaining data in the data word are to be processed, and information which specifies whether the remaining data in the data word are to be evaluated at all. If there is no match between the address portion contained in the data word and that portion of the address used to address the first memory which is not contained in the address used to address the third memory, the switching devices can be actuated such that the data stored in the first memory are output from the arrangement. The data word which is output from the third memory when the third memory is accessed may contain information which specifies which information is represented by the remaining data in the data word. The data word which is output from the third memory when the third memory is accessed may contain information which specifies how the remaining data in the data word are to be processed. The data word which is output from the third memory when the third memory is accessed may contain information which specifies whether the remaining data in the data word are to be evaluated at all. An error correction code can be used to check whether the data which are output from the arrangement are sound, and the error correction code can be used to correct corrigible errors. If the error correction code has been used to find a corrigible error, the content of the third memory can be altered such that the next time the unsound data word is accessed at least the unsound portions of this data word are replaced with data from the second memory which correct the error. An error correction code can be used to check whether the data which are output from the third memory are sound, and the error correction code is used to correct corrigible errors. At least if the error contained in the data word which is output from the third memory cannot be corrected by the error correction code, the data in question can be reloaded into the third memory from a memory provided outside of the arrangement.

The inventive arrangement is distinguished in that it contains a third memory, which is addressed by the address which is used to access the first memory or by a portion of this address and contains information about which data in the first memory are to be replaced with other data.

This means that it can very easily and quickly be ascertained how to actuate the switching devices in each case. There is no difficulty in ascertaining this quickly and easily enough for there to be no resultant delay in the output of the data which are to be output from the arrangement.

In addition, the arrangement according to the present application is of much simpler design than conventional arrangements with a redundancy memory.

Advantageous developments of the invention can be found in the description below and in the figures.

BRIEF DESCRIPTION OF THE DRAWINGS

The invention is explained in more detail below using exemplary embodiments with reference to the figures, in which.

DETAILED DESCRIPTION OF EMBODIMENTS

In the example under consideration, the arrangements described below are part of a program-controlled unit, such as a microprocessor, a microcontroller or a signal processor. Before continuing, however, it will be pointed out that there is no restriction to this. The arrangements described below may also be part of any other physical components.

A common feature of the arrangements described below is that they have the following components:

a first memory for storing data, switching devices which stipulate whether access to the first memory involves output of the data stored in the first memory or other data, a second memory for storing the other data, and a third memory, which is addressed by the address which is used to access the first memory or by a portion of this address and contains information about which data in the first memory are to be replaced with other data.

The first memory and the third memory are preferably formed by two separate memories. In the example under consideration, the first memory is formed by a flash memory, and the third memory is formed by a RAM. There is no restriction to this, however. The first memory and the third memory may be formed by arbitrary memory types independently of one another. In addition, there is also no absolute need for the first memory and the third memory to be formed by separate memories. In principle, these memories could also be formed by different memory areas in the same memory.

The second memory may be a separate memory, or may be part of a memory which simultaneously also forms the first memory, or may be part of a memory which simultaneously also forms the third memory.

In the example under consideration, the second memory stores data which actually need to be stored in the first memory but cannot be stored there because the first memory's storage elements which are to be used for the storage are faulty. In this case, appropriate actuation of the switching devices may be used to achieve a situation in which even if the first memory contains faulty storage elements it is always correct data which are output, specifically without the need for the user of the arrangement to consider any special features for this purpose; from the point of view of the user, it makes no difference whether a sound first memory or an unsound first memory is being accessed.

In the examples described below, the situation is such that access to the first memory also prompts access to the second memory and to the third memory; mutually associated data are read from the first memory, the second memory and the third memory simultaneously. For the sake of completeness, however, it will be pointed out before continuing that this is not an absolute necessity. Said memories may also be read at staggered times, and additionally provision may also be made for the second memory and/or the third memory to be read only if there is a specific reason for this.

Figure 1:
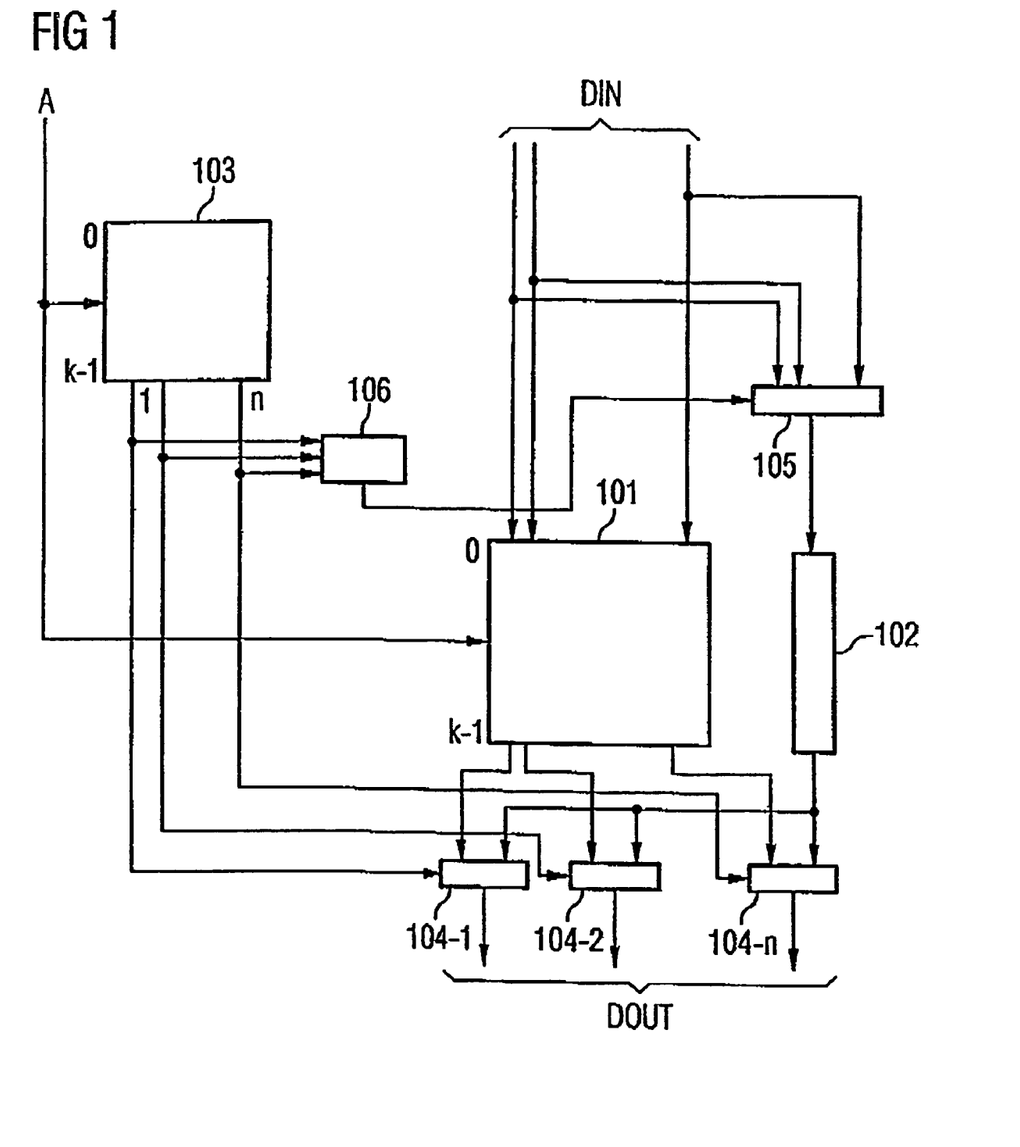
FIG. 1 shows the design of a first arrangement with a redundancy memory.

The arrangement shown in FIG. 1 contains a first memory 101, a second memory 102, a third memory 103, first switching devices 104-1 to 104-n, a second switching device 105 and a control device 106.

In addition, the arrangement contains address decoders, sense amplifiers etc., but these are not shown in FIG. 1. This incidentally also applies to the arrangements described in FIGS. 2 and 3.

The first memory 101, the second memory 102 and the first switching devices 104-1 to 104-n correspond in terms of design, circuitry and operation to the first memory 401, the second memory 405 and the switching devices 410 in the conventional arrangement described at the outset with reference to FIG. 4.

One particular difference, however, is the manner in which the first switching devices 104-1 to 104-n are actuated, and the fact that in the arrangement shown in FIG. 1 there is an additional illustration of how to proceed when writing data into the second memory 102. A further difference is that the second memory is able to output only data words which respectively comprise 1 bit, although there is no restriction to this; in principle, the data words which are output from the second memory 102 may comprise any number of bits, with (as in the case of the arrangement shown in FIG. 4) all data bits respectively being applied to all first switching devices 104-1 to 104-n.

In the arrangement shown in FIG. 1, the first switching devices 104-1 to 104-n are actuated using control data which are stored in the third memory 103. The third memory 103 stores control data words which, in the example under consideration, respectively comprise a number of bits which corresponds to the number of first switching devices 104-1 to 104-n. The individual bits are used directly, i.e. without prior decoding or other processing, as control signals for controlling the first switching devices 104-1 to 104-n. More precisely, the situation is such that bit 1 of a respective control data word is used to actuate the first switching device 104-1, bit 2 of a respective control data word is used to actuate the first switching device 104-2, bit 3 of a respective control data word is used to actuate the first switching device 104-3, . . . and bit n of a respective control data word is used to actuate the first switching device 104-n. If the first switching devices 104-1 to 104-n have more than two input connections and consequently more than one bit is required in order to actuate them, a third memory is used whose control data words comprise a correspondingly larger number of bits.

The third memory 103 is supplied with the same address A as the first memory 101, and the address space in the third memory 103 matches the address space in the first memory 101 exactly. Hence, an associated control data word is stored in the third memory for each data word which is read from the first memory 101.

This type of actuation of the first switching devices 104-1 to 104-n, more precisely this type of acquisition of the control data required for actuating the first switching devices 104-1 to 104-n, is found to be advantageous in several respects:

first, for every data word which is read from the first memory 101, it is possible to stipulate individually, i.e. independently of all other data words, whether and possibly which bit of the data word in question is to be replaced with a bit which is stored in the second memory 102, secondly, the control data required for actuating the first switching devices 104-1 to 104-n are acquired within a very short time, which means that the data DOUT which are to be output from the arrangement are available at an earlier time than is the case with the arrangement shown in FIG. 4, for example, and thirdly, no control device of complicated design needs to be provided in order to ascertain the control signals for the first switching devices 104-1 to 104-n.

The stipulation of which bit of the data DIN which are to be written to the first memory 101 is to be written to the second memory 102 may be made similarly quickly and easily. The data DIN which are to be written to the first memory 101 are supplied not only to the first memory 101 but also, additionally, to the second switching device 105 connected upstream of the second memory 102. In the example under consideration, the second switching device 105 and the first switching devices 104-1 to 104-n are formed by a multiplexer. However, the multiplexer forming the (single) second switching device 105 is actuated differently than the multiplexers forming the (many) first switching devices 104-1 to 104-n; although the multiplexer forming the second switching device 105 is actuated likewise taking into account the control data which are stored in the third memory 103, these control data cannot be used directly, but rather need to be recoded. The recoding is done by the control device 106. The control data are recoded such that of the data DIN which are to be written to the first memory 101 that bit which, in line with the control data stored in the third memory 103, needs to be replaced with the bit stored in the second memory 102 when the data stored in the first memory 101 are later read is written to the second memory 102. Such recoding is possible with very low complexity, which means that the control device 106 may firstly be of very simple design, and the recoding can take place within a very short time.

It may be found to be advantageous if the arrangement shown in FIG. 1 is modified such that the control data contained in the third memory 103 are stored in coded form. By way of example, provision may be made for the control data in binary-coded form to represent the number of the bit which is to be replaced, from the bits which are output from the first memory 101, with the bit which is output from the second memory 102. In this case, a decoding apparatus would need to be provided between the third memory 103 and the first switching devices 104-1 to 104-n, said decoding apparatus converting the control data stored in the third memory 103 into the control data which are required for actuating the first switching devices 104-1 to 104-n. In return, however, it would be possible to dispense with the control device 106, and also the third memory 103 could be designed to be very much smaller than is the case with the arrangement shown in FIG. 1. Since the decoding to be performed by the additional decoding apparatus is very easy to perform, the decoding apparatus can be of very simple design and the decoding to be performed by the decoding apparatus can take place within a very short time, which means that in this case too the advantages as for the arrangement shown in FIG. 1 are obtained.

If the second memory 102 outputs more than one redundant bit for each instance of read access to the first memory 101, it is also possible to reduce the complexity for implementing the arrangement shown in FIG. 1 by not applying every redundant bit to all of the first switching devices 104-1 to 104-n. By way of example, provision could be made for a first redundant bit to be applied only to the first switching devices which are associated with the more significant bits of the output data DOUT, and for a second redundant bit to be applied only to the first switching devices which are associated with the less significant bits of the output data DOUT.

Figure 2:
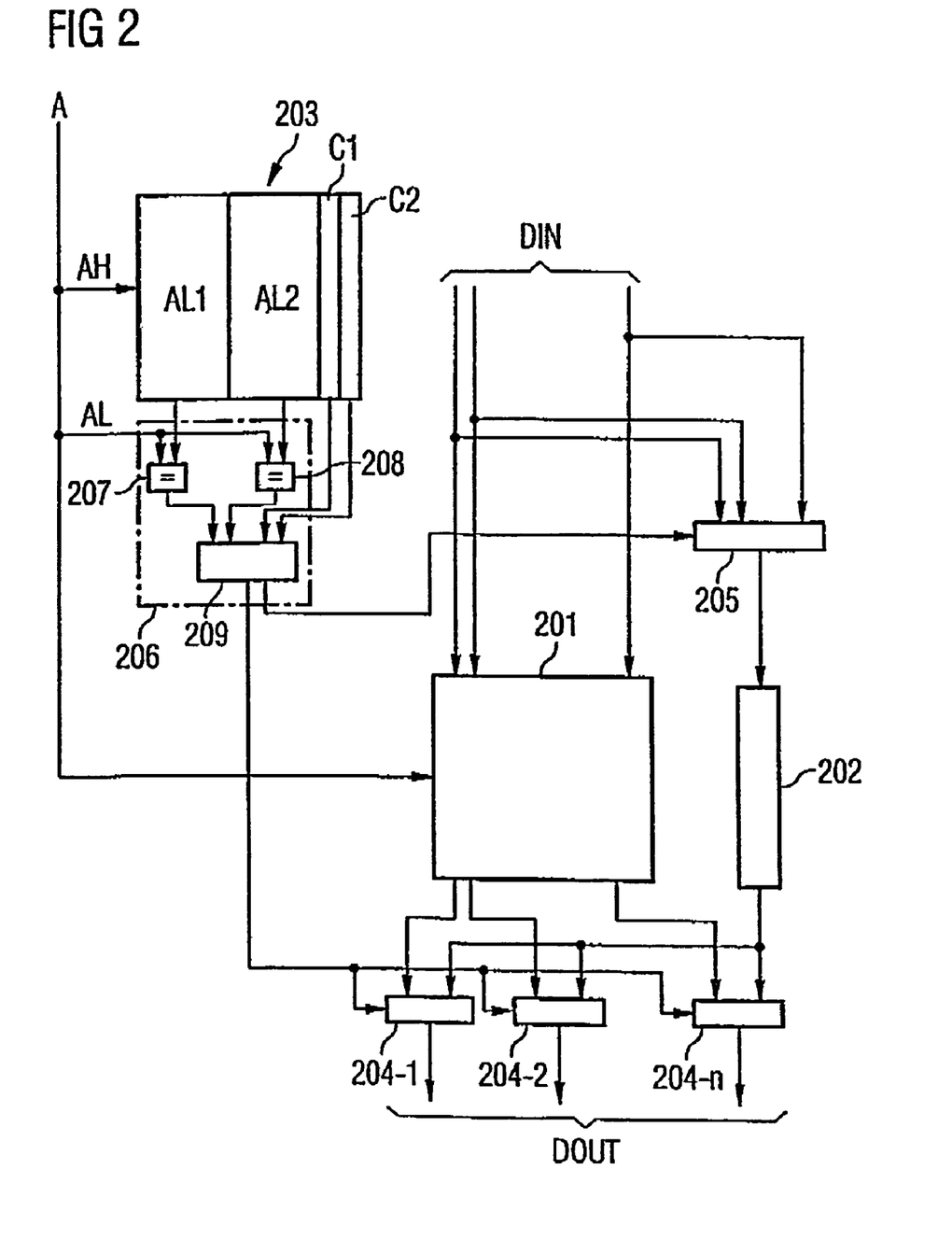
FIG. 2 shows the design of a second arrangement with a redundancy memory.

The arrangement shown in FIG. 2 contains a first memory 201, a second memory 202, a third memory 203, first switching devices 204-1 to 204-n, a second switching device 205 and a control device 206, with the control device 206 containing a first comparison device 207, a second comparison device 208 and an evaluation device 209.

The first memory 201, the second memory 202, the first switching devices 204-1 to 204-n and the second switching device 205 correspond to the first memory 101, to the second memory 102, to the first switching devices 104-1 to 104-n and to the second switching device 105 in the arrangement shown in FIG. 1.

What is different, however, is the manner in which the control signals for the first switching devices 204-1 to 204-n and the second switching device 205 are ascertained. Although these are ascertained, in this case too, by taking into account the control data in the third memory 203, the control data are different than the control data which are stored in the third memory 103 in the arrangement shown in FIG. 1. In addition, the third memory 203 is also addressed differently.

The first memory 201, like the first memory 101 in the arrangement shown in FIG. 1, is addressed using an address A. To address the third memory 203, however, an address AH is used, the address AH being a particular portion of the address A. More precisely, the address AH is a portion of the address A which comprises only a particular number of the most significant bits of the address A, the number of most significant bits being able to be arbitrary. Upon application of the address AH to the third memory 203, the latter outputs a data word which comprises a first address portion AL1, a second address portion AL2, information C1 associated with the first address portion AL1 and information C2 associated with the second address portion AL2.

The first address portion AL1 contains the least significant bits of a first address which points to an area within the first memory 201 which (area) contains faulty storage elements. More precisely, the situation is such
    that the address AH applied to the third memory 203 is the base address of an area of the first memory 201 which (area) stores a plurality of data words, and
    that the first address portion AL1 is the address of a data word, stored in partly faulty storage elements within the memory area in the first memory 201 which (memory area) is specified by the address AH.

The information C1 associated with the first address portion AL1 contains information about how to actuate the switching devices 204-1 to 204-n and 205 if the first memory 201 is accessed at an address A which is made up of the address portions AH and AL1. This information is the information which is stored in the third memory 103 in the arrangement shown in FIG. 1 at the address A made up of the addresses AH and AL1, for example.

A similar situation applies to the second address portion AL2 and to the information associated therewith. The second address portion AL2 contains the least significant bits of a second address which points to an area within the first memory 201 which (area) contains faulty storage elements. More precisely, the situation is such
    that the address AH applied to the third memory 203 is the base address of an area of the first memory 201 which (area) stores a plurality of data words, and
    that the second address portion AL2 is the address of a data word stored in partly faulty storage elements within the memory area in the first memory 201 which (memory area) is specified by the address AH.

The information C2 associated with the second address portion AL2 contains information about how to actuate the switching devices 204-1 to 204-n and 205 if the first memory 201 is accessed at an address A which is made up of the address portions AH and AL2. This information is the information which is stored in the third memory 103 in the arrangement shown in FIG. 1 at the address A made up of the addresses AH and AL2, for example.

For the sake of completeness, it will be pointed out that more or fewer address portions A1x and associated information Cx may also be contained for each data word in the third memory 203.

Unlike the arrangement shown in FIG. 1, the arrangement shown in FIG. 2 does not store the control data which are to be used for actuating the switching devices 204-1 to 204-n and 205 for every address A, but rather only for those addresses which are used to access data words stored in partly faulty storage elements.

Normally, access to the first memory 201 does not result in any access to faulty storage elements, which means that the switching devices 204-1 to 204-n are actuated, as standard, such that the data which are read from the first memory 201 are used as output data DOUT. Only in certain cases, more precisely when the address used to access the first memory matches the address made up of the address portions AH and AL1, or matches the address made of the address portions AH and AL2, is it necessary to actuate the switching elements 204-1 to 204-n differently, in which case the actuation is effected taking into account the information stored in the third memory 203, more precisely taking into account the information C1 or C2 stored in the third memory 203.

The switching elements 204-1 to 204-n are actuated by the control device 206. The control device 206 contains a number of comparison devices which corresponds to the number of address portions A1x which each data word in the third memory 203 may contain an evaluation device. The comparison devices are denoted by the reference symbols 207 and 208 in FIG. 2, and the evaluation device is denoted by the reference symbol 209.

The comparison device 207 compares the address portion AL1 which the control data word which is output from the third memory 203 contains with an address portion AL, the address portion AL comprising those address bits of the address supplied to the first memory 201 which are not contained in the address portion AH. The comparison device 208 compares the address portion AL2 which the control data word which is output from the third memory 203 contains with the address portion AL.

The evaluation device 209 evaluates the comparison results and, on the basis of this, decides how the switching devices 204-1 to 204-n are to be actuated. More precisely, the situation is such
   that if neither the comparison carried out by the comparison device 207 nor the comparison carried out by the comparison device 208 produce a match, the switching devices 204-1 to 204-n are actuated by the evaluation device 209 such that the data which are output from the first memory 201 are used as output data DOUT,
   that if the comparison carried out by the comparison device 207 produces a match, the switching devices 204-1 to 204-n are actuated by the evaluation device 209 in the manner prescribed by the control data C1, and
   that if the comparison carried out by the comparison device 208 produces a match, the switching devices 204-1 to 204-n are actuated by the evaluation device 209 in the manner prescribed by the control data C2.

The actuation of the second switching device 205 (while data DIN are being written to the first memory 201 and to the second memory 202) is likewise performed by the control device 206. In this context, the procedure is as for the actuation of the first switching devices 204-1 to 204-n. However, the control signals used for the (single) switching device 205 are naturally different than for the (many) first switching devices 204-1 to 204-n, although the control signals for the second switching device are also stipulated taking into account the control data C1 or C2, respectively. In this regard, additional reference is made to the statements relating to the actuation of the second switching device 105 in the arrangement shown in FIG. 1.

The operations to be carried out by the control device 206 are of a very simple nature and can be performed within a very short time. The arrangement shown in FIG. 2 therefore has the same advantages as the arrangement shown in FIG. 1, and on top of that manages with a much smaller third memory.

Figure 3:
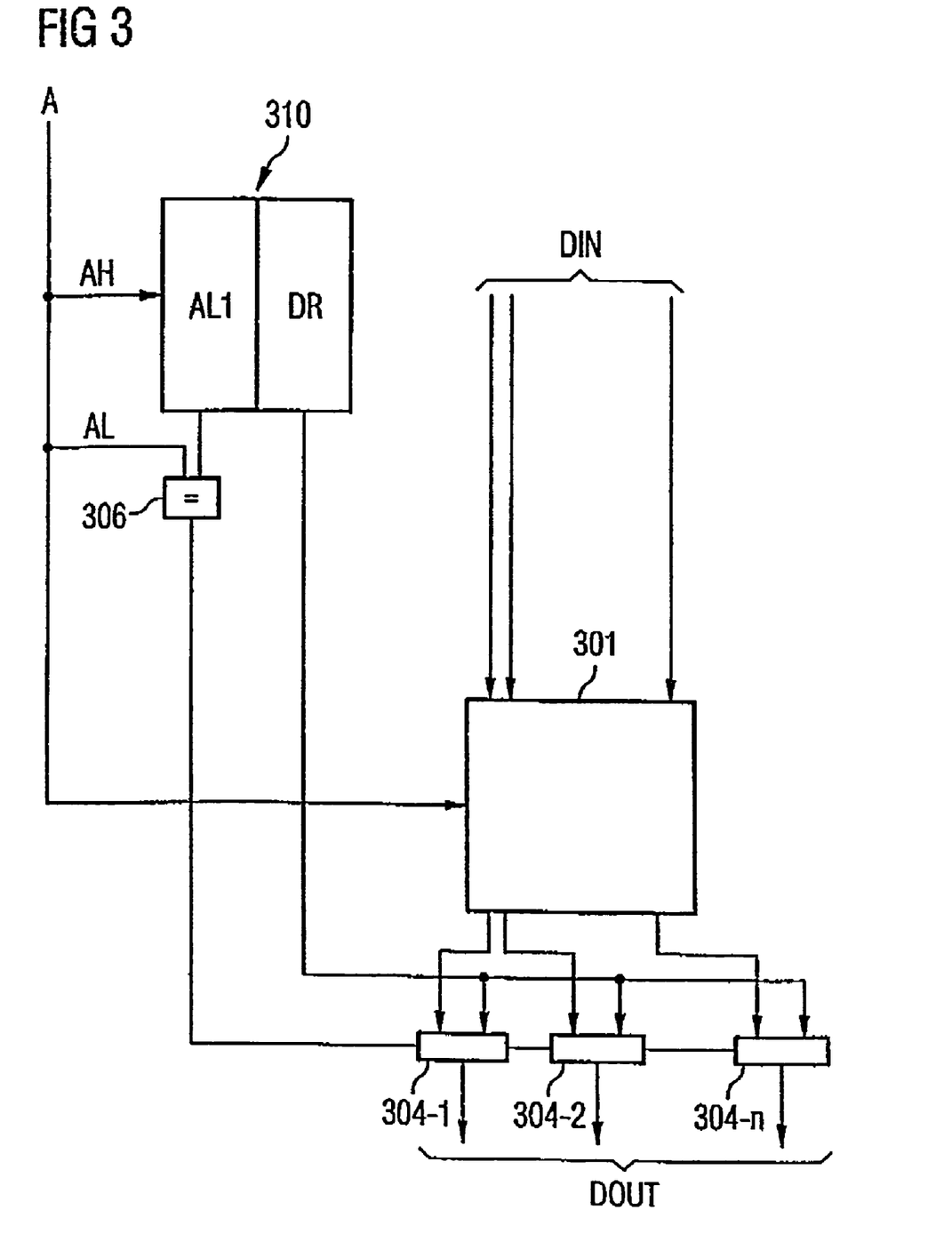
FIG. 3 shows the design of a third arrangement with a redundancy memory.

The arrangement shown in FIG. 3 contains a first memory 301, a further memory 310, switching devices 304-1 to 304-n and a control device 306.

The first memory 301 and the switching devices 304-1 to 304-n correspond to the first memory 201 and the switching devices 204-1 to 204-n in the arrangement shown in FIG. 2.

The further memory 310 corresponds to a combination of the second memory 202 and of the third memory 203 in the arrangement shown in FIG. 2. It firstly contains information about which data in the first memory 301 are to be replaced, and at the same time stores the other data which are to be output instead of the data stored in the first memory.

The memory 310 is addressed by an address AH which corresponds to the address AH which was used to address the third memory 203 in the arrangement shown in FIG. 2.

The data word which is output from the memory 310 in response to the address AH being applied to said memory contains an address field and a data field, where
   the address field stores an address portion AL1 which corresponds to the address portion AL1 which the data word which is output from the third memory 203 in the arrangement shown in FIG. 2 contains, and
   the data field stores data DR which are to be output instead of the data stored in the first memory 301 at the address A when the address A corresponds to the address made up of the address components AH and AL1.

The address portion AL1 is supplied to the control device 306, and the data DR are supplied to the switching devices 304-1 to 304-n, so that each switching device is supplied with 1 bit of the data which are output from the first memory and one bit of the data DR which are stored in the memory 310. The data DR respectively contain as many bits as a data word in the first memory 301, which means that the data DR can respectively replace a full memory word in the first memory.

Normally, access to the first memory 301 results in no access to faulty storage elements, which means that the switching devices 304-1 to 304-n are actuated, as standard, such that the data which are read from the first memory 301 are used as output data DOUT. Only in certain cases, more precisely only if the address A which is used to access the first memory 301 matches the address made up of the address portions AH and AL1, is it necessary to actuate the switching elements 204-1 to 204-n differently. In this case, all of the switching devices 304-1 to 304-n are actuated such that the data DR are used as output data DOUT.

The switching elements 304-1 to 304-n are actuated by the control device 306. The control device 306 is formed by a comparison device. This comparison device compares the address portion AL1 with the data word which is output from the memory 310 contains with an address portion AL, the address portion AL comprising those address bits of the address A applied to the first memory 301 which are not contained in the address portion AH.

The output signal from the comparison device, which signal represents the result of this comparison, is used as control signal for controlling the switching devices 304-1 to 304-n. More precisely, the situation is such
- that if the comparison carried out by the comparison device produces no match, the switching devices 304-1 to 304-n are actuated such that the data which are output from the first memory 301 are used as output data DOUT, and
- that if the comparison carried out by the comparison device produces a match, the switching devices 304-1 to 304-n are actuated such that the data DR which are output from the memory 310 are used as output data DOUT.

In the example described, the data DR have respectively replaced a full data word in the first memory 301. However, provision should also be made for the data DR respectively to contain only the unsound bits of the data words in the first memory, and for each data word in the memory 310 to contain additional information which specifies which bits of the data word in the first memory are to be replaced by which bits of the data DR.

Provision can also be made for the data which are to be output instead of the data stored in the first memory 301 to be stored in another memory, and for the data words in the memory 310 to contain, instead of the data DR, the address at which the data which are to be output instead of the data stored in the first memory are stored.

The operations to be carried out by the control device 306 are of a very simple nature and can be carried out within a very short time. The arrangement shown in FIG. 3 therefore has the same advantages as the arrangement shown in FIG. 1, and on top of that manages with fewer and smaller memories.

Particularly in the arrangements described above with reference to FIGS. 1 and 2, but also in the arrangement described with reference to FIG. 3, it may be found to be advantageous if the information stored in the third memory 103, 203, 310 do not relate in each case to individual data words in the first memory 101, 201, 301, but rather respectively apply to memory areas comprising a plurality of data words.

Independently of this, it may be found to be advantageous for all of the arrangements presented here if the third memory 103, 203, 310 or elsewhere stores information which reveals whether the data stored in the first memory 101, 201, 301 are to be replaced with redundant data at all, or whether the data which are stored in the first memory (and are possibly corrected using an error correction code) are to be output from the arrangement generally. Depending on requirements, this information may also relate alternatively to individual data words in the first memory, or to memory areas comprising a plurality of data words, or to the entire first memory.

It may also be found to be advantageous if the data words which are output from the third memory contain information which specifies which information represent the remaining data in the respective data word or which specifies how the remaining data in the data word are to be processed. This allows the arrangement to operate alternatively or alternately in the manner of the arrangement shown in FIG. 1 or in the manner of the arrangement shown in FIG. 2 or in the manner of the arrangement shown in FIG. 3.

Similarly, in all of the arrangements presented here, provision may be made for the third memory or elsewhere to store an error correction code (ECC) which can be used to identify and correct errors in the data which are read from the third memory 103, 203, 310. As a result, it is also possible to correct errors which are held in the third memory. Sometimes, particularly if the ECC used cannot correct an identified error, provision may also be made for the data words stored in the third memory which contain an incorrigible error to be reloaded into the third memory from a memory provided outside of the arrangement, and for the data reloaded into the third memory to be used from then on. The reloading may be prompted by the hardware or by the program executed by the program-controlled unit.

If the arrangement stores an ECC which can be used to identify and correct errors contained in the data DOUT which are output from the arrangement, provision may be made for the data stored in the third memory 103, 203, 310 to be altered, upon identification of an error which the ECC can correct in the data DOUT which are output from the arrangement, such that this error does not occur again when the unsound data word is next accessed, but rather is corrected using appropriate redundant data. The specific way in which this is done is dependent on the information stored in the third memory.

In the case of the arrangement described with reference to FIG. 3, this merely requires that the data DR be altered accordingly or that a new entry be generated in the third memory.

In the case of the arrangements described with reference to FIGS. 1 and 2, this first of all requires that the redundant bits which are read from the second memory 102, 202, 310 whenever the first memory is accessed comprise a redundant bit which always has the value 0 and another redundant bit which always has the value 1, and that said bits are respectively applied to all of the first switching devices 104-x, 204-x, 304-x. If this prerequisite is satisfied, any bits in any data words in the first memory can be set to the value 0 or to the value 1 by modifying the control information stored in the third memory for controlling the first switching devices or by adding appropriate entries to the third memory.

Since, in the example under consideration, the third memory 103, 203, 310 is formed by a rewritable memory such as a RAM, a register bank or the like, its content may be altered at arbitrary times, that is to say even during normal operation of the arrangement. Preferably, upon identification of a corrigible error in the data DOUT which are output from the arrangement, not only the content of the third memory is altered but also the content of the memory from which the content of the third memory is loaded into the third memory. The effect which can be achieved by this is that a change in the content of the third memory which has been made during normal operation of the arrangement remains effective even after turning off (and the associated erasure of the third memory) in the interim.

If the arrangement is designed to use an error correction code to identify and possibly to correct the errors which are contained in the data words which are output from the first memory and/or in the data words which are output from the third memory, provision may be made
- for no such check or for just a restricted check, for example a check which can only identify errors but cannot correct errors, to be carried out, and
- for the memory areas which become free as a result of no error correction code being stored or of a less extensive error code being stored to be used to store redundancy data and/or to store control data for controlling the use of the redundancy data.

The arrangements described above allow unsound data in the first memory to be replaced with redundancy data quickly and easily regardless of the details of the practical implementation.

We claim:

1. An arrangement comprising
a first memory for storing data which is addressed by an address having a first and second portion,
switching devices which stipulate whether access to the first memory involves output of the data stored in the first memory or other data,
a second memory for storing the other data, and
a third memory, which is addressed by the first portion of the address which is used to access the first memory to read a data word that contains information under said first portion of the address including an address portion, this address portion being a respective partial address of a faulty data word within the first memory specified by said address, and further data, wherein these further data are used only if there is a match between the address portion and the second portion of the address.

2. The arrangement as claimed in claim 1, wherein the first memory and the second memory are formed by different areas of a single memory.

3. The arrangement as claimed in claim 1, wherein the second memory and the third memory are formed by different areas of a single memory.

4. The arrangement as claimed in claim 1, wherein the third memory is formed by a reprogrammable memory.

5. The arrangement as claimed in claim 1, wherein the third memory is formed by a RAM.

6. The arrangement as claimed in claim 1, wherein a switching device is provided for each bit of the data which are to be output from the arrangement.

7. The arrangement as claimed in claim 1, wherein the switching devices each have a plurality of input connections, with one bit of data stored in the first memory being applied to one input connection and one or more bits of data stored in the second memory being applied to one or more other input connections.

8. The arrangement as claimed in claim 1, wherein the switching devices are formed by multiplexers.

9. The arrangement as claimed in claim 1, wherein data stored in the second memory are data which actually need to be stored in the first memory but cannot be stored there because the storage elements which are to be used for storing these data are faulty.

10. The arrangement as claimed in claim 1, wherein access to the first memory also involves access to the second memory.

11. The arrangement as claimed in claim 1, wherein access to the first memory also involves access to the third memory.

12. The arrangement as claimed in claim 1, wherein the data word which is output from the third memory when the third memory is accessed contains the control data which are to be used to actuate the switching devices.

13. The arrangement as claimed in claim 1, wherein the data word which is output from the third memory when the third memory is accessed contains data which specify which switching devices are to be actuated such that they switch through data stored in the second memory instead of the data stored in the first memory.

14. The arrangement as claimed in claim 1, wherein the second and third memory are combined into one memory and the data word which is output from the combined memory contains the other data.

15. The arrangement as claimed in claim 1, wherein the further data comprise data which is output from the third memory when the third memory is accessed and contains data from the group consisting of: the other data, the address at which the other data are stored, information which specifies which information is represented by the remaining data in the data word, information which specifies how the remaining data in the data word are to be processed, and information which specifies whether the remaining data in the data word are to be evaluated at all.

16. The arrangement as claimed in claim 1, wherein if there is no match between the address portion contained in the data word and that portion of the address used to address the first memory which is not contained in the address used to address the third memory, the switching devices are actuated such that the data stored in the first memory are output from the arrangement.

17. The arrangement as claimed in claim 1, wherein the data word which is output from the third memory when the third memory is accessed contains information which specifies which information is represented by the remaining data in the data word.

18. The arrangement as claimed in claim 1, wherein the data word which is output from the third memory when the third memory is accessed contains information which specifies how the remaining data in the data word are to be processed.

19. The arrangement as claimed in claim 1, wherein the data word which is output from the third memory when the third memory is accessed contains information which specifies whether the remaining data in the data word are to be evaluated at all.

20. The arrangement as claimed in claim 1, wherein an error correction code is used to check whether the data which are output from the arrangement are sound, and the error correction code is used to correct corrigible errors.

21. The arrangement as claimed in claim 20, wherein if the error correction code has been used to find a corrigible error, the content of the third memory is altered such that the next time the unsound data word is accessed at least the unsound portions of this data word are replaced with data from the second memory which correct the error.

22. The arrangement as claimed in claim 1, wherein an error correction code is used to check whether the data which are output from the third memory are sound, and the error correction code is used to correct corrigible errors.

23. The arrangement as claimed in claim 22, wherein at least if the error contained in the data word which is output from the third memory cannot be corrected by the error correction code, the data in question are reloaded into the third memory from a memory provided outside of the arrangement.

* * * * *